(12) United States Patent
Saji et al.

(10) Patent No.: US 10,951,192 B2
(45) Date of Patent: Mar. 16, 2021

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo (JP)

(72) Inventors: Mari Saji, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 236 days.

(21) Appl. No.: 16/159,762

(22) Filed: Oct. 15, 2018

(65) Prior Publication Data

US 2019/0149128 A1    May 16, 2019

(30) Foreign Application Priority Data

Nov. 16, 2017    (JP) .............................. JP2017-220761

(51) Int. Cl.
*H03H 9/02* (2006.01)
*H03H 9/145* (2006.01)
(Continued)

(52) U.S. Cl.
CPC .... *H03H 9/02574* (2013.01); *H03H 9/02015* (2013.01); *H03H 9/02559* (2013.01);
(Continued)

(58) Field of Classification Search
CPC ........... H03H 9/02015; H03H 9/02559; H03H 9/02574; H03H 9/02858; H03H 9/02881;
(Continued)

(56) References Cited

U.S. PATENT DOCUMENTS 8,294,331 B2 * 10/2012 Abbott ................. H03H 9/1457
310/313 B
2013/0285768 A1 * 10/2013 Watanabe ................ H03H 3/02
333/193

(Continued)

FOREIGN PATENT DOCUMENTS

JP    2016-136712 A    7/2016
WO    2015/198897 A1    12/2015

(Continued)

OTHER PUBLICATIONS

Official Communication issued in Korean Patent Application No. 10-2018-0125145, dated Nov. 26, 2019.

*Primary Examiner* — Barbara Summons
(74) *Attorney, Agent, or Firm* — Keating & Bennett, LLP

(57) ABSTRACT

An elastic wave device includes a piezoelectric substrate and an interdigital transducer electrode on the piezoelectric substrate, the piezoelectric substrate including a piezoelectric layer and a high-acoustic-velocity member layer, the piezoelectric layer being stacked on the high-acoustic-velocity member layer. The piezoelectric layer is made of lithium tantalate. Denoting an elastic wave propagation direction as a first direction, and a direction perpendicular or substantially perpendicular to the first direction as a second direction, a central region, low-acoustic-velocity regions, and high-acoustic-velocity regions are provided in the interdigital transducer electrode in the second direction. The low-acoustic-velocity regions include mass-adding films on electrode fingers. Denoting a film thickness normalized to a wavelength determined by the electrode finger pitch of the interdigital transducer electrode as a wavelength-normalized film thickness (%), a product of the wavelength-normalized film thickness of the mass-adding films and the density (g/cm$^3$) of the mass-adding films is about 13.4631 or less.

20 Claims, 19 Drawing Sheets

(51) Int. Cl.
*H03H 9/64* (2006.01)
*H03H 9/72* (2006.01)
*H03H 9/54* (2006.01)
*H03H 9/70* (2006.01)
*H04B 1/10* (2006.01)

(52) U.S. Cl.
CPC .... *H03H 9/02818* (2013.01); *H03H 9/14532* (2013.01); *H03H 9/14541* (2013.01); *H03H 9/64* (2013.01); *H03H 9/6489* (2013.01); *H03H 9/725* (2013.01); *H03H 9/542* (2013.01); *H03H 9/706* (2013.01); *H04B 1/1027* (2013.01)

(58) Field of Classification Search
CPC .............. H03H 9/058; H03H 9/14532; H03H 9/14541; H03H 9/542; H03H 9/545; H03H 9/64; H03H 9/6483; H03H 9/6489; H03H 9/706; H03H 9/725; H03H 9/02818; H04B 1/1027

USPC ................................ 333/133, 193, 195, 196
See application file for complete search history.

(56) References Cited

U.S. PATENT DOCUMENTS

| 2016/0126928 | A1* | 5/2016 | Ruile ................. H03H 9/02535 310/313 B |
| 2016/0211829 | A1* | 7/2016 | Iwaki .................... H03H 9/725 |
| 2017/0093367 | A1 | 3/2017 | Mimura |
| 2018/0097508 | A1 | 4/2018 | Iwamoto et al. |
| 2018/0102761 | A1 | 4/2018 | Takai et al. |

FOREIGN PATENT DOCUMENTS

WO 2016/208446 A1 12/2016
WO 2017/013968 A1 1/2017

\* cited by examiner

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-220761 filed on Nov. 16, 2017. The entire contents of this application are hereby incorporated herein by reference.

BACKGROUND OF THE INVENTION

1. Field of the Invention

The present invention relates to an elastic wave device, a high-frequency front-end circuit, and a communication apparatus.

2. Description of the Related Art

Elastic wave devices have been widely used as, for example, filters of cellular phones. International Publication No. 2016/208446 discloses an example of an elastic wave device. The elastic wave device includes a multilayer body including a high-acoustic-velocity member, a low-acoustic-velocity film, and a piezoelectric film stacked in this order, and an interdigital transducer electrode disposed on the piezoelectric film. The interdigital transducer electrode includes a central region, low-acoustic-velocity regions located at the outer side portions of the central region in the direction perpendicular to an elastic wave propagation direction, and high-acoustic-velocity regions located at the outer side portions of the low-acoustic-velocity regions. The interdigital transducer electrode in the low-acoustic-velocity regions has a larger film thickness than in the central region. Thus, the low-acoustic-velocity regions are provided. The foregoing structure can increase the quality factor.

However, studies by the inventors of preferred embodiments of the present invention have newly revealed that in the elastic wave device as described in International Publication No. 2016/208446, the transverse-mode intensity depends largely on the width of each low-acoustic-velocity region to easily cause transverse-mode spurious responses. Here, low-order transverse-mode spurious responses occur in the vicinity of the resonant frequency in a fundamental mode and, thus, need to be particularly suppressed. However, it has been newly discovered that in the interdigital transducer electrode having a large film thickness in the low-acoustic-velocity regions, low-order transverse-mode spurious responses occur easily, in some cases.

SUMMARY OF THE INVENTION

Preferred embodiments of the present invention provide elastic wave devices, high-frequency front-end circuits, and communication apparatuses which are capable of reducing or preventing transverse-mode spurious responses.

According to a preferred embodiment of the present invention, an elastic wave device includes a piezoelectric substrate and an interdigital transducer electrode on the piezoelectric substrate, the piezoelectric substrate including a piezoelectric layer and a high-acoustic-velocity member layer in which the acoustic velocity of a bulk wave that propagates through the high-acoustic-velocity member layer is higher than the acoustic velocity of an elastic wave that propagates through the piezoelectric layer, the piezoelectric layer being stacked directly or indirectly on the high-acoustic-velocity member layer, in which the piezoelectric layer is made of lithium tantalate, the interdigital transducer electrode includes a first busbar, a second busbar, the first busbar and the second busbar facing each other, first electrode fingers each including an end portion connected to the first busbar, and second electrode fingers each including an end portion connected to the second busbar, the first electrode fingers being interdigitated with the second electrode fingers, in which denoting an elastic wave propagation direction as a first direction, and denoting a direction perpendicular or substantially perpendicular to the first direction as a second direction, a portion in which the first electrode fingers overlap the second electrode fingers in the first direction is defined as an intersecting region, the intersecting region includes a central region located in the middle of the intersecting region in the second direction, a first low-acoustic-velocity region located on a side of the central region adjacent to the first busbar, an acoustic velocity in the first low-acoustic-velocity region being lower than an acoustic velocity in the central region, and a second low-acoustic-velocity region located on a side of the central region adjacent to the second busbar, an acoustic velocity in the second low-acoustic-velocity region being lower than an acoustic velocity in the central region, the first low-acoustic-velocity region and the second low-acoustic-velocity region include mass-adding films disposed on the first electrode fingers and the second electrode fingers, the interdigital transducer electrode includes a first high-acoustic-velocity region and a second high-acoustic-velocity region, an acoustic velocity in the first high-acoustic-velocity region and the second high-acoustic-velocity region being higher than an acoustic velocity in the central region, the first low-acoustic-velocity region is located between the central region and the first high-acoustic-velocity region, the second low-acoustic-velocity region is located between the central region and the second high-acoustic-velocity region, and in which denoting a film thickness normalized to a wavelength determined by the electrode finger pitch of the interdigital transducer electrode as a wavelength-normalized film thickness (%), the product of the wavelength-normalized film thickness of the mass-adding films and a density ($g/cm^3$) of the mass-adding films is about 13.4631 or less.

In an elastic wave device according to a preferred embodiment of the present invention, a combination of the material of the mass-adding films and an upper limit of the wavelength-normalized film thickness of the mass-adding films may be selected from combinations presented in Table 1:

TABLE 1

| | Density ($g/cm^3$) | Upper limit of wavelength-normalized film thickness (%) |
|---|---|---|
| Al | about 2.69 | about 5 |
| Ti | about 4.54 | about 2.97 |
| Cu | about 8.93 | about 1.51 |
| Ta | about 16.67 | about 0.81 |
| Au | about 19.3 | about 0.7 |
| Pt | about 21.37 | about 0.63 |
| Aluminum oxide | about 3.98 | about 3.38 |
| Silicon oxide | about 2.21 | about 6.09 |
| Germanium oxide | about 6.2 | about 2.17 |
| Tantalum oxide | about 8.47 | about 1.59 |

In an elastic wave device according to a preferred embodiment of the present invention, the mass-adding films may be made of a metal.

In an elastic wave device according to a preferred embodiment of the present invention, the mass-adding films may be made of Pt and may have a wavelength-normalized film thickness of about 0.55% or less. In this case, the effective coupling coefficient $K_{eff}$ in a third-order transverse mode is able to be greatly reduced. Thus, third-order transverse-mode spurious responses are able to be further reduced or prevented.

In an elastic wave device according to a preferred embodiment of the present invention, the mass-adding films may be made of an oxide. In this case, interdiffusion between the mass-adding films and the interdigital transducer electrode is less likely to occur. Thus, the interdigital transducer electrode is not easily degraded.

In an elastic wave device according to a preferred embodiment of the present invention, a low-acoustic-velocity film in which an acoustic velocity of an elastic wave that propagates through the low-acoustic-velocity film is lower than an acoustic velocity of an elastic wave that propagates through the piezoelectric layer may be disposed between the high-acoustic-velocity member layer and the piezoelectric layer. In this case, the elastic wave energy is able to be effectively confined to the piezoelectric layer side.

An elastic wave device according to a preferred embodiment of the present invention may further include a supporting substrate, in which the high-acoustic-velocity member layer may be a high-acoustic-velocity film disposed between the supporting substrate and the low-acoustic-velocity film. In this case, the elastic wave energy is able to be effectively confined to the piezoelectric layer side.

In an elastic wave device according to a preferred embodiment of the present invention, the high-acoustic-velocity member layer may be a supporting substrate.

In an elastic wave device according to a preferred embodiment of the present invention, the piezoelectric layer may have a wavelength-normalized film thickness of about 350% or less. In this case, the Q characteristics are able to be effectively improved.

According to a preferred embodiment of the present invention, a high-frequency front-end circuit includes an elastic wave device according to a preferred embodiment of the present invention and a power amplifier.

According to a preferred embodiment of the present invention, a communication apparatus includes a high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the attached drawings so as to clarify the present invention.

Preferred embodiments described herein are illustrative. It should be noted that partial replacement and combination of configurations in different preferred embodiments may be made.

Figure 1:
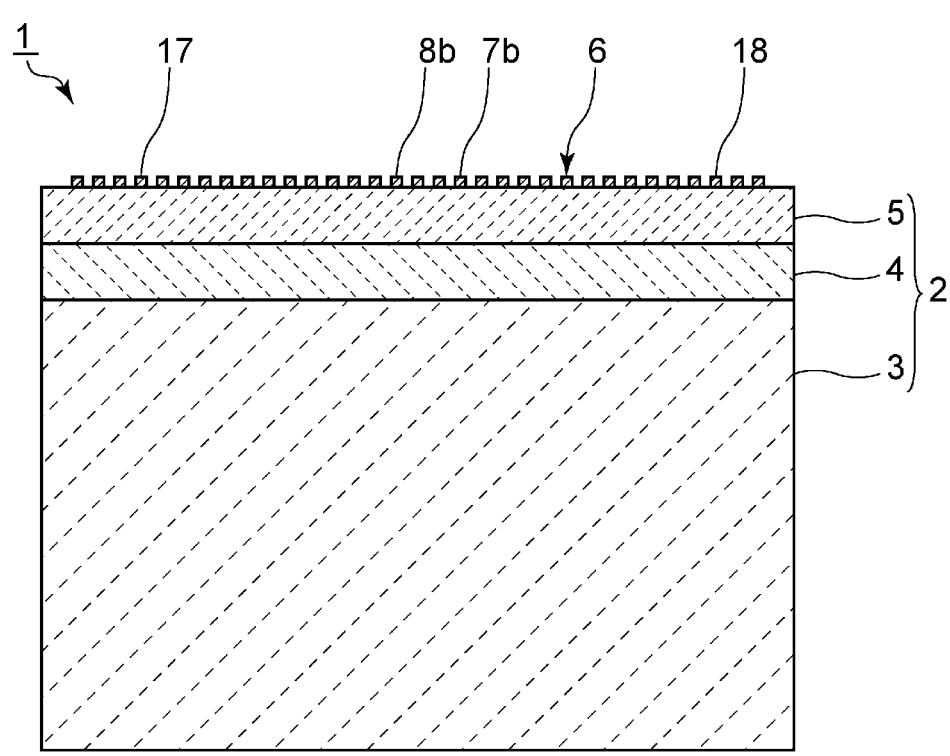
FIG. 1 is a schematic elevational cross-sectional view of an elastic wave device according to a first preferred embodiment of the present invention.

FIG. 1 is a schematic elevational cross-sectional view of an elastic wave device according to a first preferred embodiment of the present invention.

An elastic wave device 1 includes a piezoelectric substrate 2. The piezoelectric substrate 2 is a multilayer body including a supporting substrate 3, a low-acoustic-velocity film 4, and a piezoelectric layer 5 stacked in this order. An interdigital transducer electrode 6 is disposed on the piezoelectric layer 5. The application of an alternating voltage to the interdigital transducer electrode 6 excites elastic waves. A reflector 17 and a reflector 18 are disposed on the respective sides of the interdigital transducer electrode 6 in the elastic wave propagation direction. In the present preferred embodiment, the elastic wave device 1 is preferably an elastic wave resonator, for example.

The piezoelectric layer 5 is preferably made of lithium tantalate (LiTaO$_3$), for example. The Euler angles ($\phi$, $\theta$, $\varphi$) of the piezoelectric layer 5 are preferably, but not particularly limited to, about (0°, 50°, 0°), for example, in the present preferred embodiment.

The low-acoustic-velocity film 4 is a film in which the acoustic velocity of an elastic wave that propagates through the low-acoustic-velocity film 4 is lower than the acoustic velocity of an elastic wave that propagates through the piezoelectric layer 5. The low-acoustic-velocity film 4 is preferably made of silicon oxide, for example, in the present preferred embodiment. Silicon oxide is expressed as SiO$_x$. The low-acoustic-velocity film 4 of the elastic wave device 1 is preferably made of SiO$_2$, for example. The material of the low-acoustic-velocity film 4 is not limited to SiO$_2$ and may be silicon oxide in which x is a real number other than 2. The low-acoustic-velocity film 4 may preferably be made of, for example, a material mainly containing glass, silicon oxynitride, tantalum oxide, or a compound containing a silicon oxide doped with fluorine, carbon, or boron. Any material in which an acoustic velocity is relatively low may be used for the low-acoustic-velocity film 4.

The supporting substrate 3 in the present preferred embodiment is a high-acoustic-velocity member layer in which the acoustic velocity of an elastic wave that propagates through the supporting substrate 3 is higher than the acoustic velocity of an elastic wave that propagates through the piezoelectric layer 5. Specifically, the supporting substrate 3 is preferably made of silicon (Si), for example. The supporting substrate 3 defining and functioning as the high-acoustic-velocity member layer may preferably be made of, for example, aluminum nitride, aluminum oxide, silicon carbide, silicon nitride, silicon oxynitride, diamond-like carbon (DLC), silicon, sapphire, a piezoelectric material such as lithium tantalate, lithium niobate, or quartz crystal, a ceramic material such as alumina, zirconia, cordierite, mullite, steatite, or forsterite, diamond, magnesia, a material mainly including any of the foregoing materials, or a material mainly including any of mixtures of the foregoing materials. Any material in which an acoustic velocity is relatively high may be used for the high-acoustic-velocity member layer.

The piezoelectric layer 5 is indirectly stacked on the high-acoustic-velocity member layer with the low-acoustic-velocity film 4 provided therebetween in this preferred embodiment. The piezoelectric layer 5 may be directly stacked on the high-acoustic-velocity member layer.

While the interdigital transducer electrode 6 is preferably made of Al, for example, the material of the interdigital transducer electrode 6 is not limited thereto. The interdigital transducer electrode 6 may include a single-layer metal film or a multilayer metal film in which metal layers are stacked. Each of the reflectors 17 and 18 is also preferably made of the same material as the interdigital transducer electrode 6 in the present preferred embodiment.

The elastic wave device 1 includes the piezoelectric substrate 2 including the supporting substrate 3 defining and functioning as a high-acoustic-velocity member layer, the low-acoustic-velocity film 4, and the piezoelectric layer 5 stacked in this order. Thus, the elastic wave energy is effectively confined to the piezoelectric layer 5 side.

Figure 2:
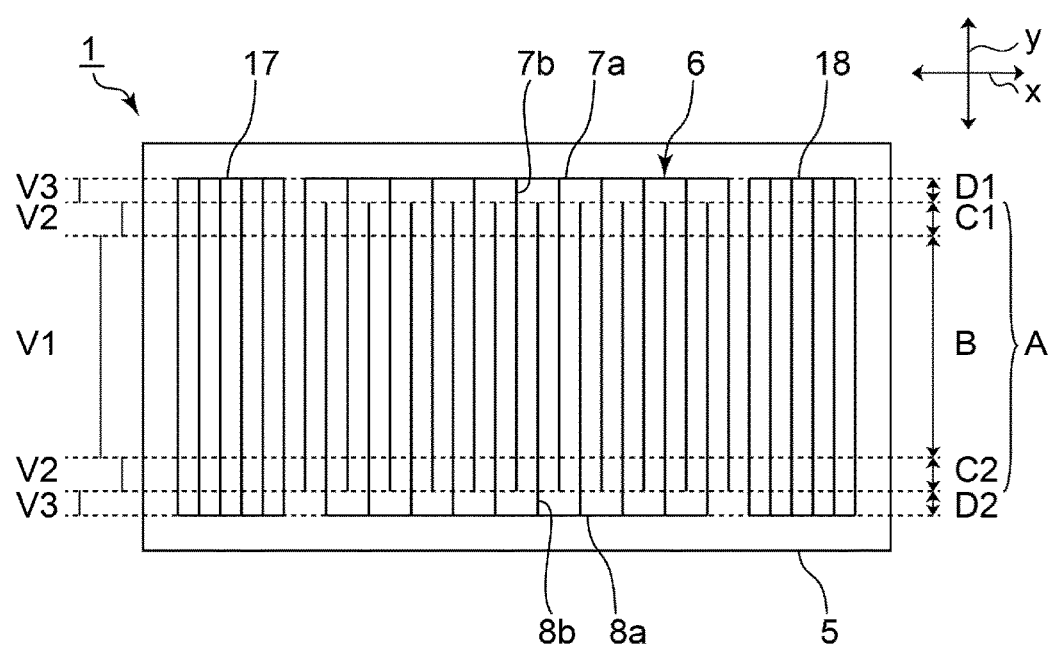
FIG. 2 is a schematic plan view of the elastic wave device according to the first preferred embodiment of the present invention.
Figure 3:
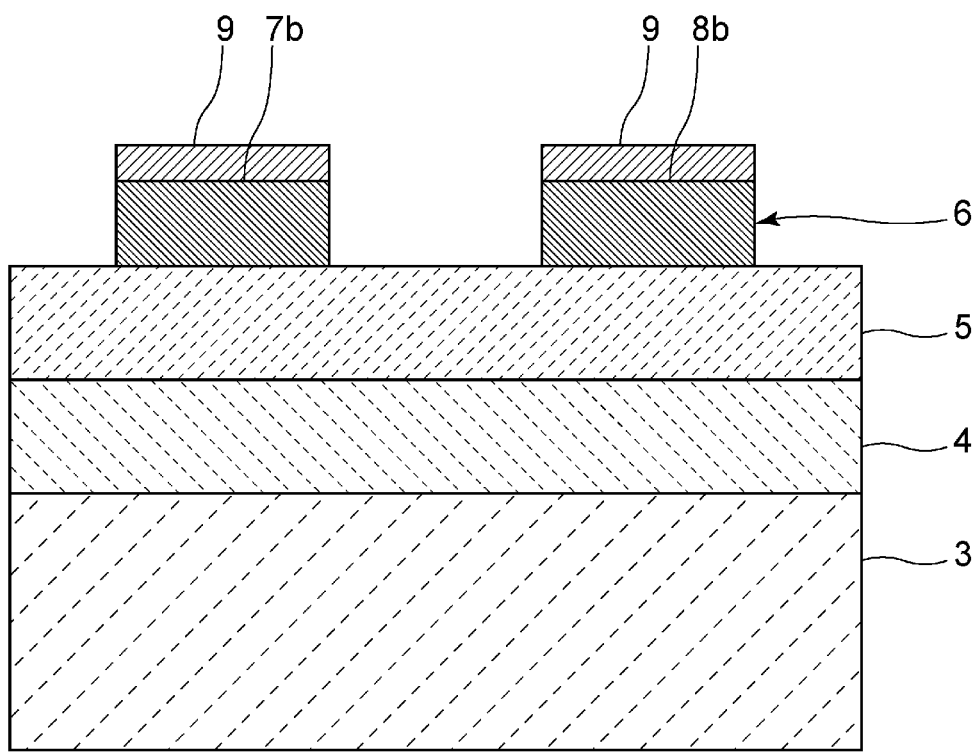
FIG. 3 is an enlarged, schematic elevational cross-sectional view of a portion near the tip of a second electrode finger of an interdigital transducer electrode according to the first preferred embodiment of the present invention.

FIG. 2 is a schematic plan view of the elastic wave device according to the first preferred embodiment. FIG. 3 is an enlarged, schematic elevational cross-sectional view of a portion near the tip of a second electrode finger of an interdigital transducer electrode according to the first preferred embodiment.

As illustrated in FIG. 2, the interdigital transducer electrode 6 includes a first busbar 7a and a second busbar 8a facing each other. The interdigital transducer electrode 6 includes first electrode fingers 7b each having an end portion connected to the first busbar 7a. The interdigital transducer electrode 6 further includes second electrode fingers 8b each having an end portion connected to the second busbar 8a. The first electrode fingers 7b and the second electrode fingers 8b interdigitate with each other.

Here, the elastic wave propagation direction is defined as a first direction x, and a direction perpendicular or substantially perpendicular to the first direction x is defined as a second direction y. In the interdigital transducer electrode 6, a portion in which the first electrode fingers 7b and the second electrode fingers 8b overlap with each other in the first direction x is defined as an intersecting region A. The intersecting region A includes a central region B located in the middle of the intersecting region A in the second direction y.

The intersecting region A includes a first edge region C1 located on a side of the central region B adjacent to the first busbar 7a and a second edge region C2 located on a side of the central region B adjacent to the second busbar 8a. As illustrated in FIG. 3, mass-adding films 9 are disposed on the first electrode fingers 7b and the second electrode fingers 8b in the first edge region C1. In the present preferred embodiment, because the mass-adding films 9 are disposed on the first electrode fingers 7b and the second electrode fingers 8b, an acoustic velocity in the first edge region C1 is lower than an acoustic velocity in the central region B, thus providing a first low-acoustic-velocity region. Similarly, a second low-acoustic-velocity region in which an acoustic velocity in the second low-acoustic-velocity region is lower than an acoustic velocity in the central region B is provided in the second edge region C2. Here, denoting an acoustic velocity in the central region B as V1, and denoting an acoustic velocity in the first low-acoustic-velocity region and the second low-acoustic-velocity region as V2, V2<V1.

In the first edge region C1, for example, the mass-adding films 9 may be disposed on the first electrode fingers 7b or the second electrode fingers 8b. Similarly, in the second edge region C2, for example, the mass-adding films 9 may be disposed on the first electrode fingers 7b or the second electrode fingers 8b.

The mass-adding films 9 are preferably made of Pt, for example, in the present preferred embodiment.

The interdigital transducer electrode 6 includes a first outside region D1 located at an outer side portion of the first edge region C1 in the second direction y. The interdigital transducer electrode 6 further includes a second outside region D2 located at an outer side portion of the second edge region C2 in the second direction y. The first edge region C1 is located between the central region B and the first outside region D1. The second edge region C2 is located between the central region B and the second outside region D2. In the present preferred embodiment, the first outside region D1 is located between the first edge region C1 and the first busbar 7a. The second outside region D2 is located between the second edge region C2 and the second busbar 8a.

In the first outside region D1, only the first electrode fingers 7b among the first and second electrode fingers 7b and 8b are disposed. In the second outside region D2, only the second electrode fingers 8b among the first and second electrode fingers 7b and 8b are disposed. Thus, an acoustic velocity in the first outside region D1 and the second outside region D2 is higher than an acoustic velocity in the central region B. Denoting an acoustic velocity of an elastic wave in the first outside region D1 and the second outside region D2 as V3, V1<V3. As just described, a first high-acoustic-velocity region is provided in the first outside region D1, and a second high-acoustic-velocity region is provided in the second outside region D2.

The relationship among the acoustic velocities is as follows: V2<V1<V3. FIG. 2 illustrates the relationship among the acoustic velocities. In FIG. 2, a position closer to the left indicates a higher acoustic velocity.

In the interdigital transducer electrode 6, the central region B, the first low-acoustic-velocity region, and the first high-acoustic-velocity region are provided in this order in the second direction y. Similarly, the central region B, the second low-acoustic-velocity region, and the second high-acoustic-velocity region are provided in this order in the second direction y. Thus, the elastic wave device 1 operates in a piston mode, thus reducing or preventing the transverse-mode spurious responses.

A protective film, which is not illustrated in FIG. 1, may be disposed on the piezoelectric layer 5 so as to cover the interdigital transducer electrode 6 and the mass-adding films 9.

The elastic wave device 1 according to the present preferred embodiment includes the piezoelectric substrate 2 and the interdigital transducer electrode 6 disposed on the piezoelectric substrate 2. The piezoelectric substrate 2 includes the supporting substrate 3 defining and functioning as a high-acoustic-velocity member layer and the piezoelectric layer 5. The piezoelectric layer 5 is preferably made of lithium tantalate, for example. The interdigital transducer electrode 6 includes the first low-acoustic-velocity region in which an acoustic velocity in the first low-acoustic-velocity region is lower than an acoustic velocity in the central region B, and the second low-acoustic-velocity region in which an acoustic velocity in the second low-acoustic-velocity region is lower than an acoustic velocity in the central region B. The first low-acoustic-velocity region and the second low-acoustic-velocity region include the mass-adding films disposed on the first electrode fingers 7b and the second electrode fingers 8b. The interdigital transducer electrode 6 includes the first high-acoustic-velocity region and the second high-acoustic-velocity region, in which an acoustic velocity in the first and second high-acoustic-velocity regions is higher than an acoustic velocity in the central region B. Denoting a film thickness normalized to a wavelength determined by the electrode finger pitch of the interdigital transducer electrode 6 as a wavelength-normalized film thickness, the product of the wavelength-normalized film thickness of the mass-adding films 9 and the density of the mass-adding films 9 is preferably about 13.4631 or less, for example. Thus, the transverse-mode spurious responses are effectively reduced or prevented. This will be described below.

Elastic wave devices were produced at different film thicknesses of the mass-adding films and different widths of the first and second low-acoustic-velocity regions. Here, the width of each of the first and second low-acoustic-velocity regions refers to a dimension of each of the first and second low-acoustic-velocity regions in the second direction. These elastic wave devices have the same or substantially the same structure as in the first preferred embodiment, except for the film thickness of the mass-adding films. The effective coupling coefficients $K_{eff}$ of these elastic wave devices in the transverse mode were determined. At an effective coupling coefficient $K_{eff}$ of more than about 0.1% in the transverse mode, the transverse-mode spurious responses are increased to degrade, for example, the filter characteristics of the elastic wave device. Thus, the effective coupling coefficient $K_{eff}$ in the transverse mode is preferably about 0.1% or less, for example.

In each of the elastic wave devices, the width of the first low-acoustic-velocity region is equal or substantially equal to the width of the second low-acoustic-velocity region. Thus, in FIGS. 4 to 11, the first and second low-acoustic-velocity regions are collectively referred to as a "LOW-ACOUSTIC-VELOCITY REGION". Here, a wavelength determined by the electrode finger pitch is defined as λ. The width of the low-acoustic-velocity region is expressed as a wavelength ratio with respect to the wavelength λ.

Figure 4:
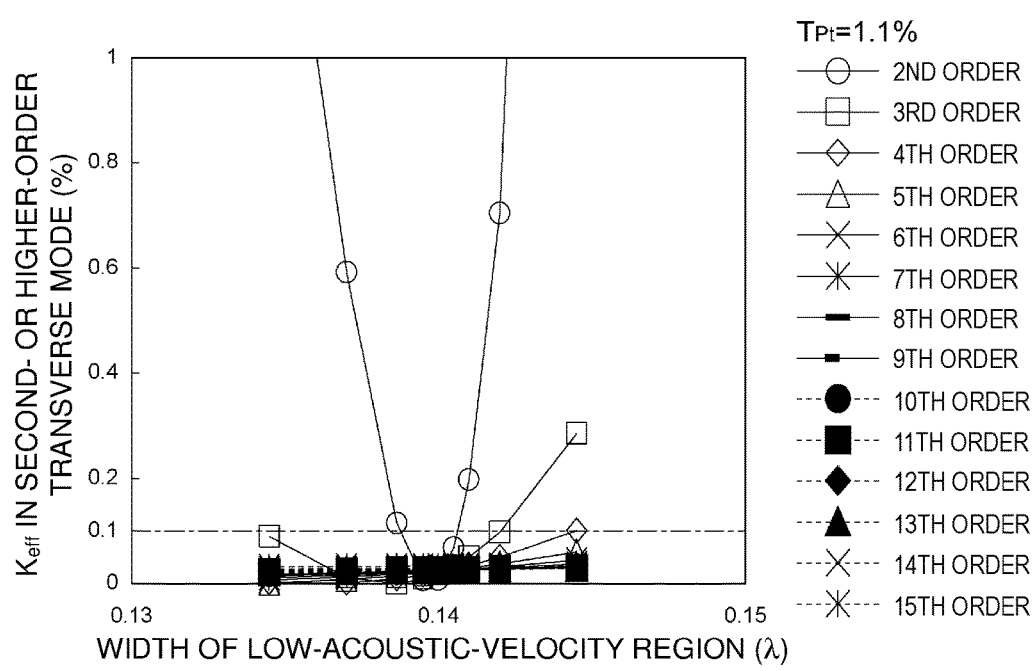
FIG. 4 illustrates the relationship between the width of a low-acoustic-velocity region and the effective coupling coefficient $K_{eff}$ in a transverse mode when mass-adding films made of Pt have a wavelength-normalized film thickness of about 1.1%.
Figure 5:
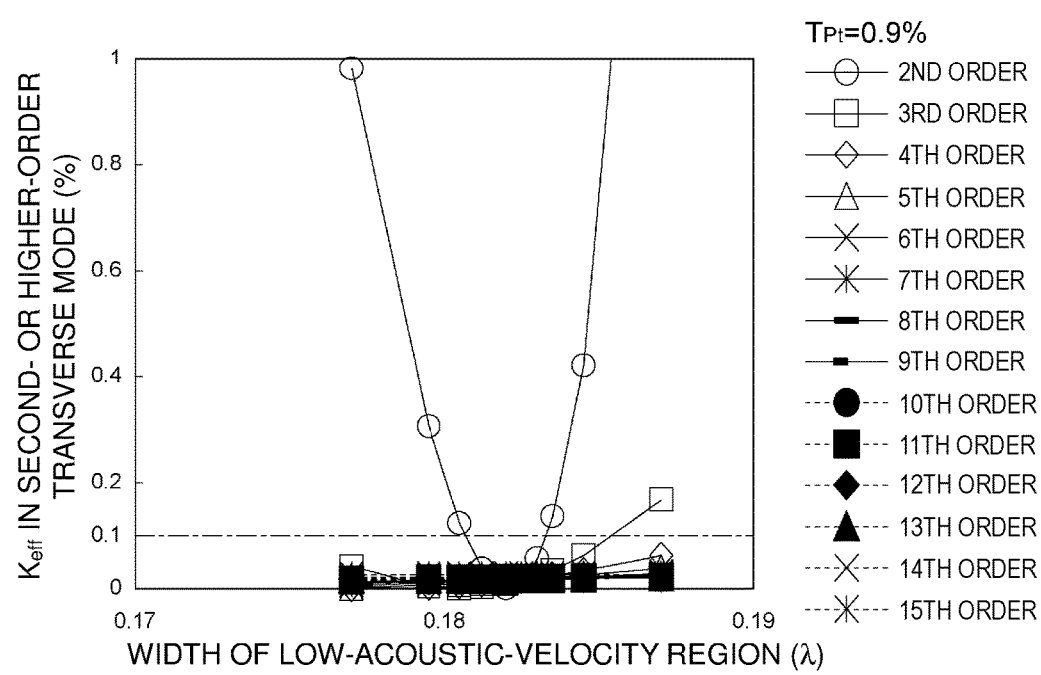
FIG. 5 illustrates the relationship between the width of the low-acoustic-velocity region and the effective coupling coefficient $K_{eff}$ in the transverse mode when the mass-adding films made of Pt have a wavelength-normalized film thickness of about 0.9%.
Figure 6:
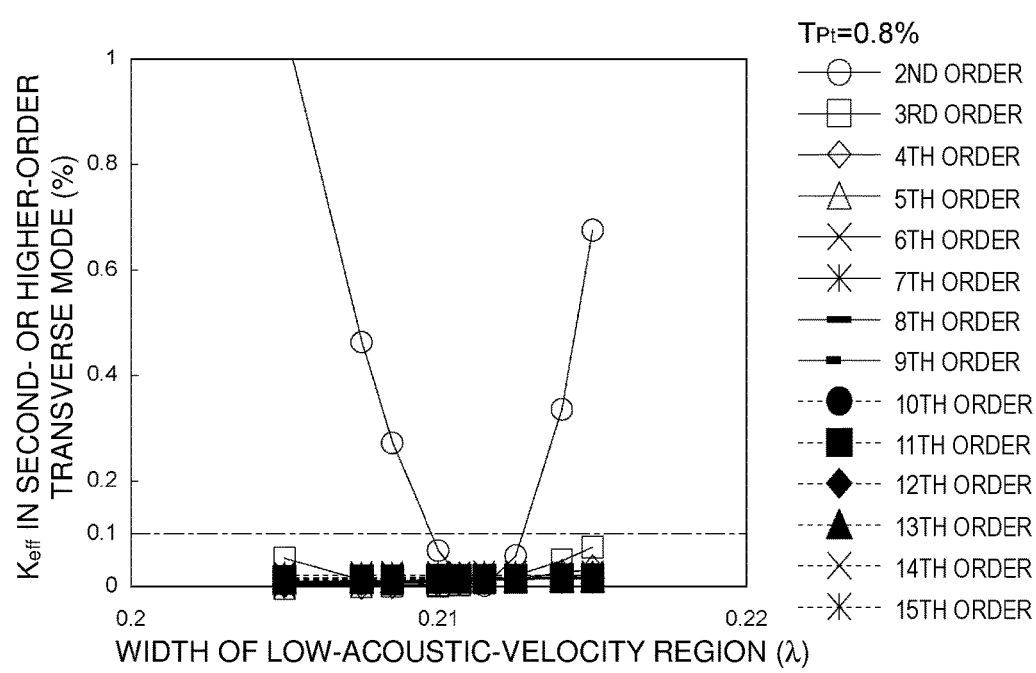
FIG. 6 illustrates the relationship between the width of the low-acoustic-velocity region and the effective coupling coefficient $K_{eff}$ in the transverse mode when the mass-adding films made of Pt have a wavelength-normalized film thickness of about 0.8%.
Figure 7:
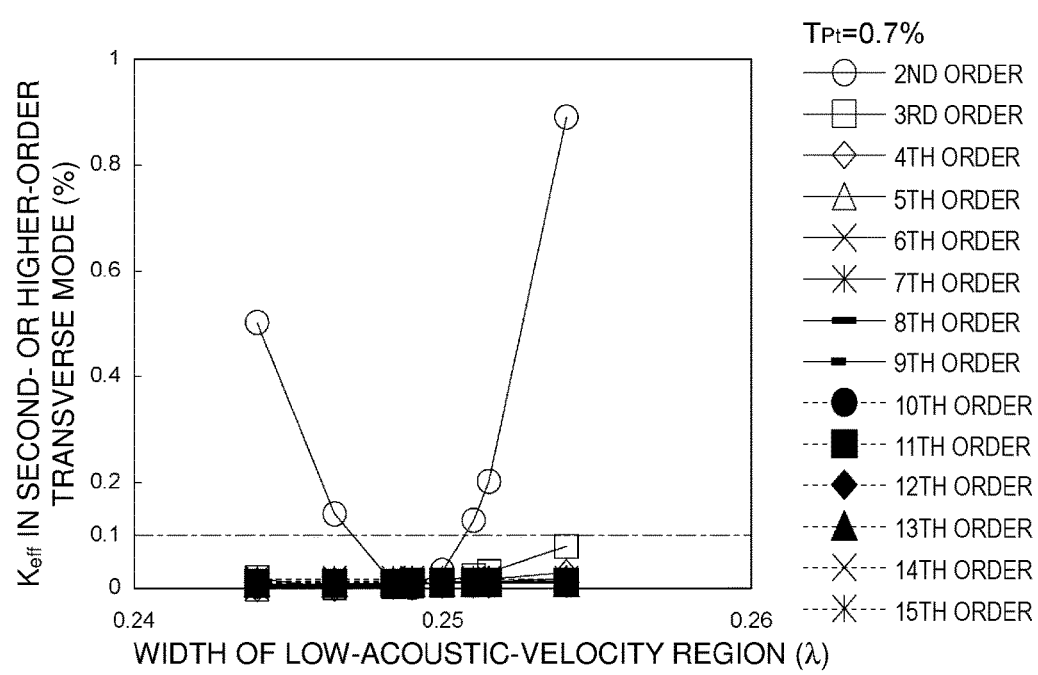
FIG. 7 illustrates the relationship between the width of the low-acoustic-velocity region and the effective coupling coefficient $K_{eff}$ in the transverse mode when the mass-adding films made of Pt have a wavelength-normalized film thickness of about 0.7%.
Figure 8:
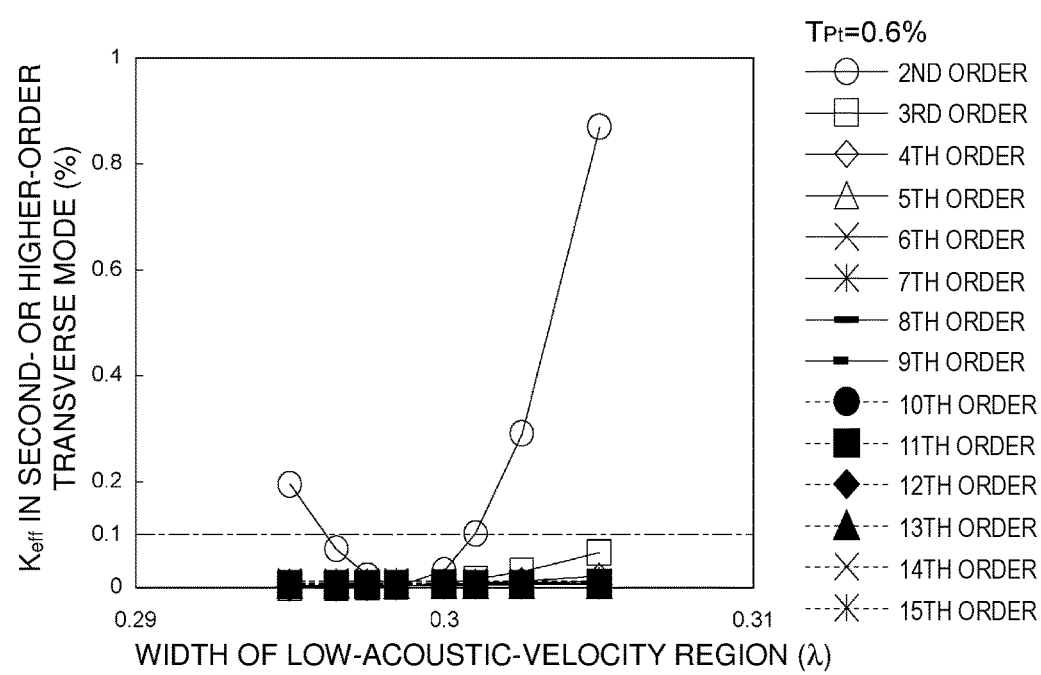
FIG. 8 illustrates the relationship between the width of the low-acoustic-velocity region and the effective coupling coefficient $K_{eff}$ in the transverse mode when the mass-adding films made of Pt have a wavelength-normalized film thickness of about 0.6%.
Figure 9:
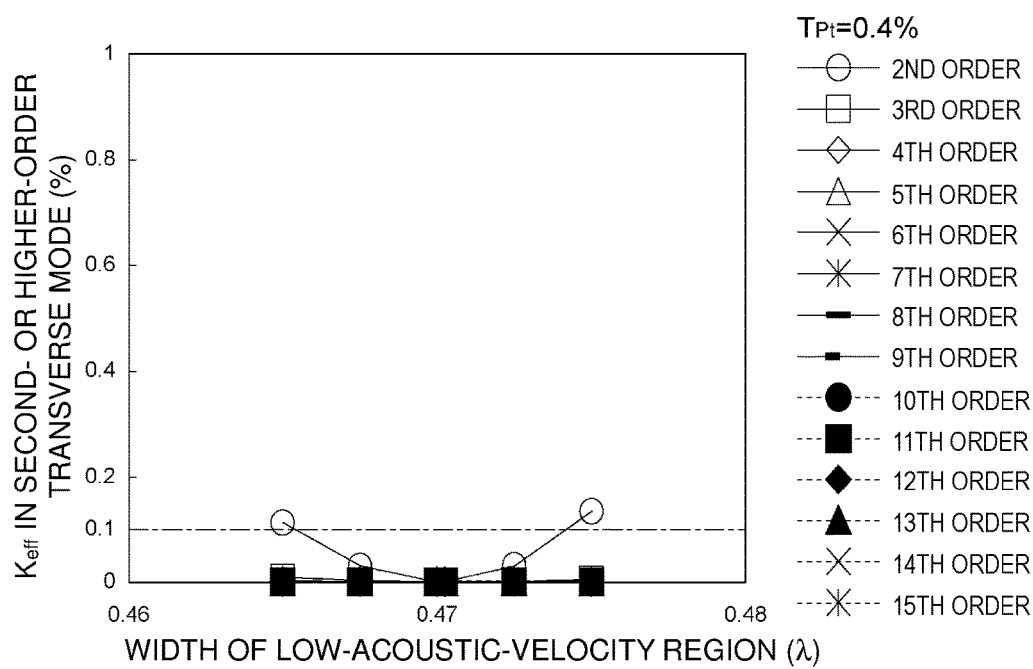
FIG. 9 illustrates the relationship between the width of the low-acoustic-velocity region and the effective coupling coefficient $K_{eff}$ in the transverse mode when the mass-adding films made of Pt have a wavelength-normalized film thickness of about 0.4%.
Figure 10:
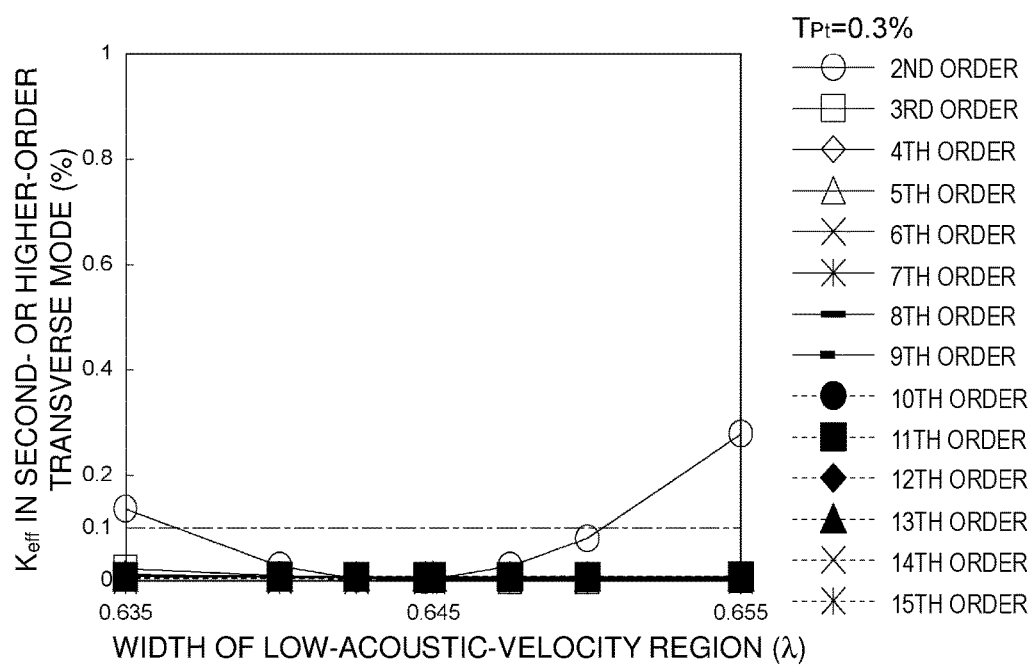
FIG. 10 illustrates the relationship between the width of the low-acoustic-velocity region and the effective coupling coefficient $K_{eff}$ in the transverse mode when the mass-adding films made of Pt have a wavelength-normalized film thickness of about 0.3%.
Figure 11:
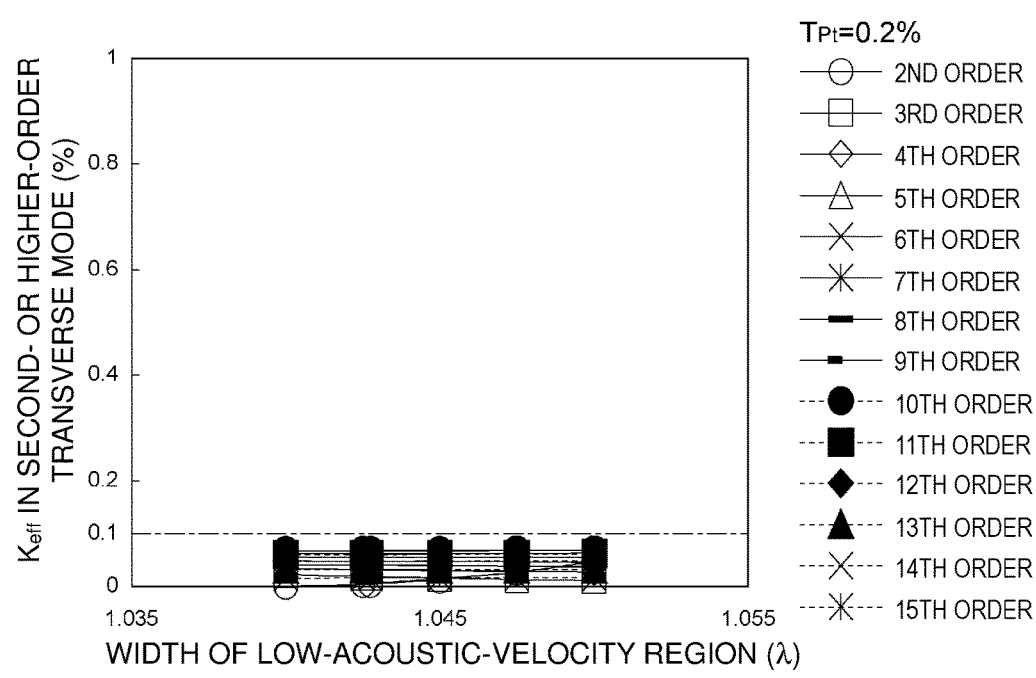
FIG. 11 illustrates the relationship between the width of the low-acoustic-velocity region and the effective coupling coefficient $K_{eff}$ in the transverse mode when the mass-adding films made of Pt have a wavelength-normalized film thickness of about 0.2%.

FIG. 4 illustrates the relationship between the width of the low-acoustic-velocity region and the effective coupling coefficient $K_{eff}$ in the transverse mode when the mass-adding films made of Pt have a wavelength-normalized film thickness of about 1.1%. FIG. 5 illustrates the relationship between the width of the low-acoustic-velocity region and the effective coupling coefficient $K_{eff}$ in the transverse mode when the mass-adding films made of Pt have a wavelength-normalized film thickness of about 0.9%. FIG. 6 illustrates the relationship between the width of the low-acoustic-velocity region and the effective coupling coefficient $K_{eff}$ in the transverse mode when the mass-adding films made of Pt have a wavelength-normalized film thickness of about 0.8%. FIG. 7 illustrates the relationship between the width of the low-acoustic-velocity region and the effective coupling coefficient $K_{eff}$ in the transverse mode when the mass-adding films made of Pt have a wavelength-normalized film thickness of about 0.7%. FIG. 8 illustrates the relationship between the width of the low-acoustic-velocity region and the effective coupling coefficient $K_{eff}$ in the transverse mode when the mass-adding films made of Pt have a wavelength-normalized film thickness of about 0.6%. FIG. 9 illustrates the relationship between the width of the low-acoustic-velocity region and the effective coupling coefficient $K_{eff}$ in the transverse mode when the mass-adding films made of Pt have a wavelength-normalized film thickness of about 0.4%. FIG. 10 illustrates the relationship between the width of the low-acoustic-velocity region and the effective coupling coefficient $K_{eff}$ in the transverse mode when the mass-adding films made of Pt have a wavelength-normalized film thickness of about 0.3%. FIG. 11 illustrates the relationship between the width of the low-acoustic-velocity region and the effective coupling coefficient $K_{eff}$ in the transverse mode when the mass-adding films made of Pt have a wavelength-normalized film thickness of about 0.2%.

In FIGS. 4 to 11, the effective coupling coefficients $K_{eff}$ in the second- and higher-order transverse modes are plotted. In the specification, the third- or lower-order transverse mode is referred to as a "low-order transverse mode". Here, the wavelength-normalized film thickness of the mass-adding films made of Pt is denoted by $T_{Pt}$. The wavelength-normalized film thicknesses $T_{Pt}$ of the mass-adding films are described in FIGS. 4 to 11. Here, it is sometimes said that even-order transverse modes are not excited because they are electrically cancelled in the interdigital transducer electrode. However, in fact, the interdigital transducer electrode may have an incompletely symmetrical structure, depending on dimensional variations during production. In this case, because the even-order transverse modes are incompletely cancelled, excitation seems to occur. Thus, in preferred embodiments of the present invention, the effective coupling coefficients $K_{eff}$ in the even-order transverse modes are targeted for reduction or prevention.

As illustrated in FIG. 4, when the wavelength-normalized film thickness $T_{pt}$ of the mass-adding films composed of Pt is about 1.1%, the width of the low-acoustic-velocity region that minimizes the effective coupling coefficient $K_{eff}$ is as small as about 0.14λ, for example. When the width of the low-acoustic-velocity region is changed from about 0.14λ, the effective coupling coefficients $K_{eff}$ in the low-order transverse modes, such as the second- and third-order transverse modes, are sharply increased. The results indicate that the effective coupling coefficient $K_{eff}$ is about 0.1% or less only when the width of the low-acoustic-velocity region is in the range of about 0.1389λ to about 0.1407λ. As just described, the range of the width of the low-acoustic-velocity region is as narrow as about 0.0018λ when the effective coupling coefficient $K_{eff}$ is about 0.1% or less, for example. As described above, when the effective coupling coefficient $K_{eff}$ in the transverse mode is more than about 0.1%, transverse-mode spurious responses are increased to degrade the filter characteristics and other parameters of the elastic wave device. In the cases illustrated in FIG. 4, the effective coupling coefficients $K_{eff}$ in the low-order transverse modes, such as the second- and third-order transverse modes, are largely changed with respect to a change in the width of the low-acoustic-velocity region. Thus, the effective coupling coefficient $K_{eff}$ is susceptible to dimensional variations during the production process. It is accordingly difficult to sufficiently reduce or prevent the transverse-mode spurious responses.

FIG. 5 in which $T_{Pt}$ is about 0.9%, FIG. 6 in which $T_{Pt}$ is about 0.8%, FIG. 7 in which $T_{Pt}$ is about 0.7%, and FIG. 8 in which $T_{Pt}$ is about 0.6% indicate that the widths of the low-acoustic-velocity region that minimizes the effective coupling coefficient $K_{eff}$ are about 0.182λ, about 0.212λ, about 0.249λ, and about 0.298λ, respectively, and that a smaller wavelength-normalized film thickness $T_{Pt}$ of the mass-adding films results in a greater width of the low-acoustic-velocity region that minimizes the effective coupling coefficient $K_{eff}$. FIG. 9 in which $T_{Pt}$ is about 0.4%, FIG. 10 in which $T_{Pt}$ is about 0.3%, and FIG. 11 in which $T_{Pt}$ is about 0.2% indicate that the widths of the low-acoustic-velocity region that minimizes the effective coupling coefficient $K_{eff}$ are about 0.47λ, about 0.645λ, and about 1.043λ, respectively, and that a much shorter wavelength-normalized film thickness $T_{Pt}$ of the mass-adding films results in a much greater width of the low-acoustic-velocity region that minimizes the effective coupling coefficient $K_{eff}$. The ranges of the width of the low-acoustic-velocity region that are able to maintain the effective coupling coefficient $K_{eff}$ to about 0.1% or less are about 0.0025λ at a wavelength-normalized film thickness $T_{Pt}$ of about 0.9%, about 0.0029λ at a wavelength-normalized film thickness about 0.8%, about 0.0038λ at a wavelength-normalized film thickness $T_{Pt}$ of about 0.7%, about 0.005λ at a wavelength-normalized film thickness $T_{Pt}$ of about 0.6%, about 0.00915λ at a wavelength-normalized film thickness $T_{Pt}$ of about 0.4%, and about as wide as 0.0148λ at a wavelength-normalized film thickness $T_{Pt}$ of about 0.3%.

Figure 12:
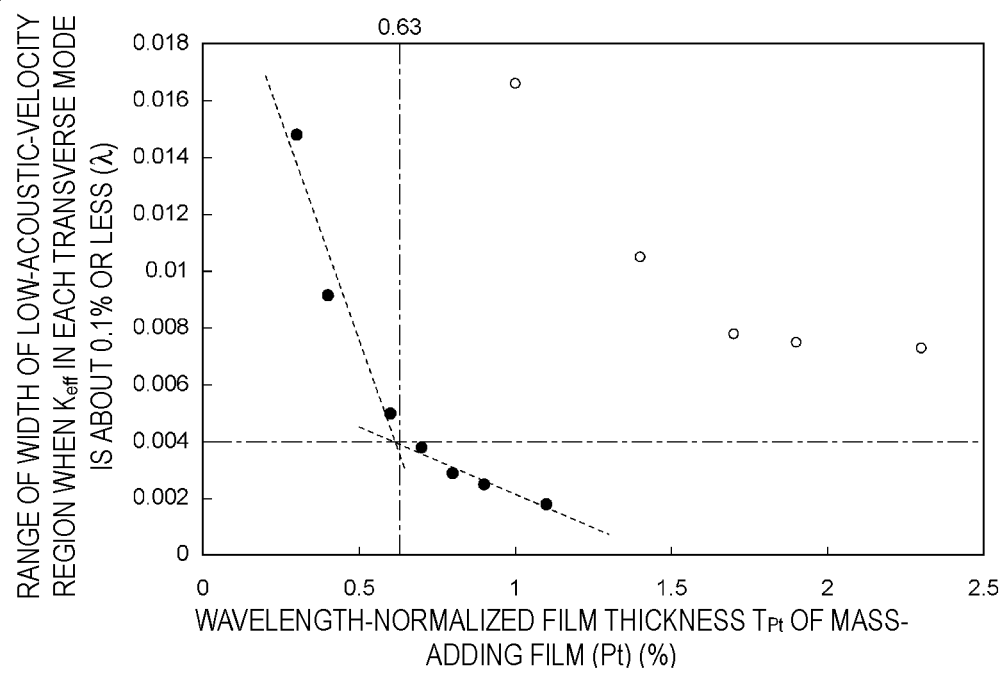
FIG. 12 illustrates, in the cases of piezoelectric substrates having structures according to the first preferred embodiment of the present invention and a reference example, the relationship between the wavelength-normalized film thickness $T_{Pt}$ of the mass-adding films composed of Pt and the range of the width of the low-acoustic-velocity region when the effective coupling coefficient $K_{eff}$ in each transverse mode is about 0.1% or less.

The ranges of the width of the low-acoustic-velocity region illustrated in FIGS. 4 to 11 are depicted with respect to $T_{Pt}$ in FIG. 12. FIG. 12 also illustrates the results of a reference example in which the piezoelectric substrate consists only of the piezoelectric layer.

FIG. 12 illustrates, in the cases of piezoelectric substrates having structures according to the first preferred embodiment and a reference example, the relationship between the wavelength-normalized film thickness $T_{Pt}$ of the mass-adding films made of Pt and the range of the width of the low-acoustic-velocity region when the effective coupling coefficient $K_{eff}$ in each transverse mode is about 0.1% or less. In FIG. 12, substantially circular black dots indicate the results of the case in which the piezoelectric substrate has the structure according to the first preferred embodiment. Substantially circular white dots indicate the results of the case in which the piezoelectric substrate consists only of the piezoelectric layer according to the reference example.

The results of the reference example indicate that in the case of the piezoelectric substrate consisting only of the piezoelectric layer, the range of the width of the low-acoustic-velocity region when the effective coupling coefficient $K_{eff}$ in each transverse mode is about 0.1% or less is wide, regardless of the wavelength-normalized film thickness $T_{Pt}$ of the mass-adding films. Accordingly, the problems solved by various preferred embodiments of the present invention are problems inherent in the case of using the piezoelectric substrate having a structure in which the piezoelectric layer and the high-acoustic-velocity member layer are stacked.

In the case in which the piezoelectric substrate has the structure according to the first preferred embodiment, when the mass-adding films made of Pt have a wavelength-normalized film thickness $T_{Pt}$ of about 0.63% or less, the range of the width of the low-acoustic-velocity region when the effective coupling coefficient $K_{eff}$ in each transverse mode is about 0.1% or less is as wide as about 0.004, or more. As indicated by broken lines in FIG. 12, the slope of the broken line indicating the range of the width of the low-acoustic-velocity region at a wavelength-normalized film thickness $T_{Pt}$ of about 0.63% or less is larger than that at a wavelength-normalized film thickness $T_{Pt}$ of more than about 0.63%. Thus, in the case in which the mass-adding films have a wavelength-normalized film thickness $T_{Pt}$ of about 0.63% or less, the range is able to be significantly increased even at a small reduction in wavelength-normalized film thickness $T_{Pt}$. Here, the product of the density of the mass-adding films and a wavelength-normalized film thickness of 0.63% is 21.37 g/cm$^3$×0.63%=13.4631. Thus, in the case in which the mass-adding films is made of Pt and the product of the density of the mass-adding films and the wavelength-normalized film thickness $T_{Pt}$ is about 13.4631 or less, the transverse-mode spurious responses are able to be effectively reduced or prevented.

Figure 13:
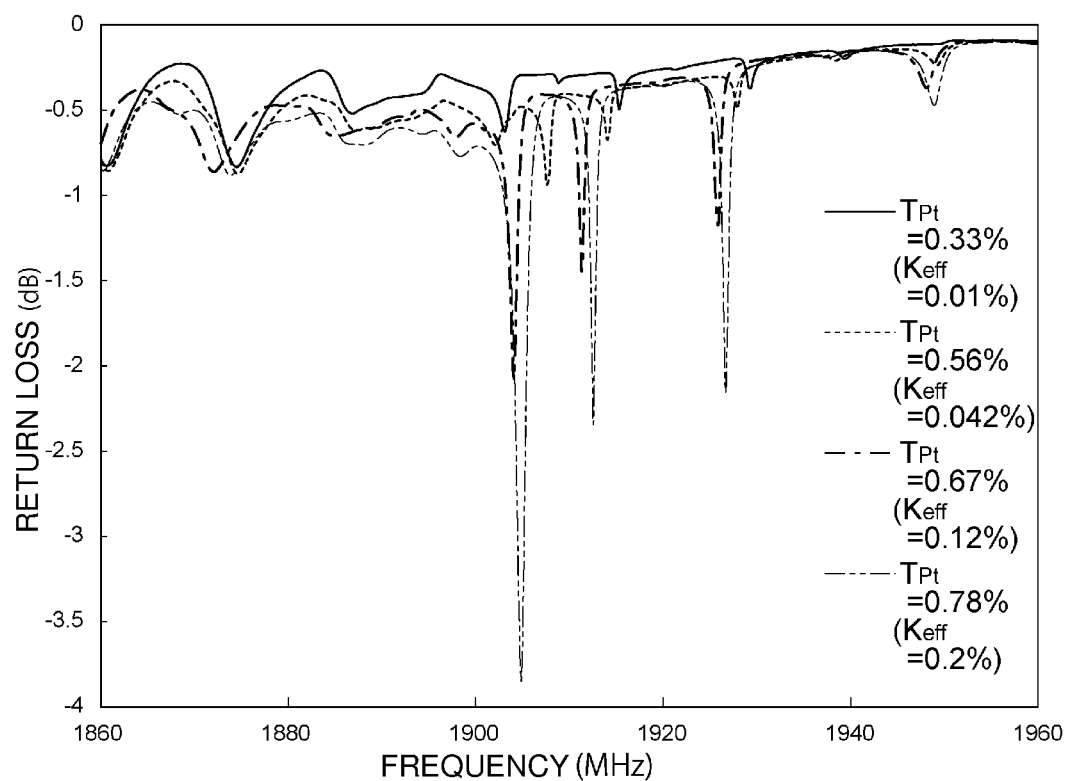
FIG. 13 illustrates the relationship between the wavelength-normalized film thickness of the mass-adding film made of Pt and the return loss.

FIG. 13 specifically illustrates the advantageous effect of reducing or preventing spurious responses. The return loss was measured at different wavelength-normalized film thicknesses of the mass-adding films made of Pt. In consideration of variations in the width of the low-acoustic-velocity region, the return loss was measured at the width of the low-acoustic-velocity region that was about 0.005λ narrower than the width of the low-acoustic-velocity region when the second-order transverse-mode effective coupling coefficient $K_{eff}$ was minimized. The wavelength-normalized film thickness $T_{Pt}$ of the mass-adding films were about 0.33%, about 0.56%, about 0.67%, and about 0.78%. In the case in which the return loss was measured, the effective coupling coefficient $K_{eff}$ was about 0.01% at a wavelength-normalized film thickness $T_{Pt}$ of about 0.33%. The effective coupling coefficient $K_{eff}$ was about 0.042% at a wavelength-normalized film thickness $T_{Pt}$ of about 0.56%. The effective coupling coefficient $K_{eff}$ was about 0.12% at a wavelength-normalized film thickness $T_{Pt}$ of about 0.67%. The effective coupling coefficient $K_{eff}$ was about 0.2% at a wavelength-normalized film thickness $T_{Pt}$ of about 0.78%.

FIG. 13 illustrates the relationship between the wavelength-normalized film thickness of the mass-adding films made of Pt and the return loss. In FIG. 13, a solid line indicates the results when the wavelength-normalized film thickness $T_{Pt}$ is about 0.33%. A broken line indicates the results when the wavelength-normalized film thickness $T_{Pt}$ is about 0.56%. A dot-dash line indicates the results when the wavelength-normalized film thickness $T_{Pt}$ is about 0.67%. A dot-dot-dash line indicates the results when the wavelength-normalized film thickness $T_{Pt}$ is about 0.78%.

As illustrated in FIG. 13, in the case in which the wavelength-normalized film thicknesses $T_{Pt}$ of the mass-adding films made of Pt are about 0.67% and about 0.78% and the effective coupling coefficient $K_{eff}$ is more than about 0.1%, large spurious responses are observed. In contrast, in the case in which the wavelength-normalized film thicknesses $T_{Pt}$ are about 0.33% and about 0.56%, which are lower than about 0.63%, and the effective coupling coefficient $K_{eff}$ in the transverse mode is about 0.1% or less, the spurious responses are able to be effectively reduced or prevented.

The effective coupling coefficient $K_{eff}$ in the transverse mode is determined by the normalized acoustic velocity and the normalized band width ratio. In the specification, the term "normalized acoustic velocity" refers to an acoustic velocity normalized to an acoustic velocity when no mass-adding films are provided. The term "normalized band width ratio" refers to a band width ratio normalized to a band width ratio when no mass-adding films are provided. In the elastic wave device having the structure according to the first preferred embodiment, the relationship between the normalized acoustic velocity and the normalized band width ratio was determined. Similarly, in the elastic wave devices having the same or substantially the same structure as in the first preferred embodiment, except that the mass-adding films were made of materials other than Pt, the relationship between the normalized acoustic velocity and the normalized band width ratio was determined. The materials of the mass-adding films were Pt, Au, Ta, Cu, Al, tantalum oxide, germanium oxide, silicon oxide, and aluminum oxide.

Figure 14:
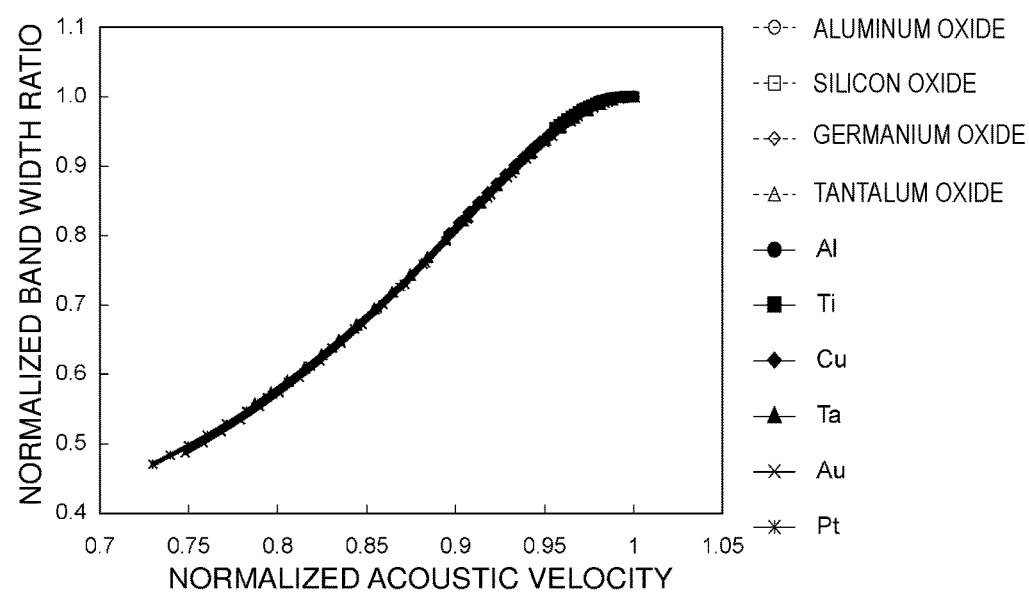
FIG. 14 illustrates the relationship among materials used for the mass-adding films, the normalized acoustic velocity, and the normalized band width ratio.

FIG. 14 illustrates the relationship among materials used for the mass-adding films, the normalized acoustic velocity, and the normalized band width ratio.

FIG. 14 indicates that the relationship between the normalized acoustic velocity and the normalized band width ratio are substantially independent of the material of the mass-adding films. Thus, the effective coupling coefficient $K_{eff}$ in the transverse mode is substantially constant, regardless of the material of the mass-adding films. Here, the normalized acoustic velocity is determined by the mass added to the interdigital transducer electrode using the mass-adding films. Accordingly, regardless of the material of the mass-adding films, when the product of the density of the mass-adding films and the wavelength-normalized film thickness is about 13.4631 or less, the transverse-mode spurious responses are able to be effectively reduced or prevented.

Table 2 presents examples of a specific combination of the material and the wavelength-normalized film thickness of the mass-adding films 9 when the product of the density and the wavelength-normalized film thickness of the mass-adding films 9 is about 13.4631 or less.

TABLE 2

| | Density (g/cm$^3$) | Upper limit of wavelength-normalized film thickness (%) |
|---|---|---|
| Al | about 2.69 | about 5 |
| Ti | about 4.54 | about 2.97 |
| Cu | about 8.93 | about 1.51 |
| Ta | about 16.67 | about 0.81 |
| Au | about 19.3 | about 0.7 |
| Pt | about 21.37 | about 0.63 |
| Aluminum oxide | about 3.98 | about 3.38 |
| Silicon oxide | about 2.21 | about 6.09 |
| Germanium oxide | about 6.2 | about 2.17 |
| Tantalum oxide | about 8.47 | about 1.59 |

In the case in which the combination of the material and the wavelength-normalized film thickness of the mass-adding films is a combination presented in Table 2, the transverse-mode spurious responses are able to be effectively reduced or prevented similarly to the first preferred embodiment.

For example, in the case of the mass-adding films 9 made of a high-density material, such as Pt or Au, even if the wavelength-normalized film thickness of the mass-adding films 9 is reduced, the first and second low-acoustic-velocity regions are able to be appropriately provided. Thus, if a protective film is disposed on the piezoelectric layer 5 so as to cover the interdigital transducer electrode 6 and the mass-adding films 9, a reduction in the wavelength-normalized film thickness of the mass-adding films 9 permits the mass-adding films 9 to be appropriately covered with the protective film. Accordingly, the reliability of the elastic wave device 1 is improved.

In the case in which the product of the density and the wavelength-normalized film thickness of the mass-adding films 9 is about 13.4631 or less, if the mass-adding films 9 are made of a low-density material, such as Al or Ti, the wavelength-normalized film thickness of the mass-adding films 9 is able to be increased. This reduces the range of variations in wavelength-normalized film thickness with respect to the wavelength-normalized film thickness. Accordingly, variations of the transverse mode are able to be reduced or prevented.

While each of the mass-adding films 9 includes a single-layer metal film in the first preferred embodiment, each mass-adding film 9 may include a diffusion-inhibiting layer or an adhesion layer having a thickness such that the effects of preferred embodiments of the present invention are not impaired.

Figure 15:
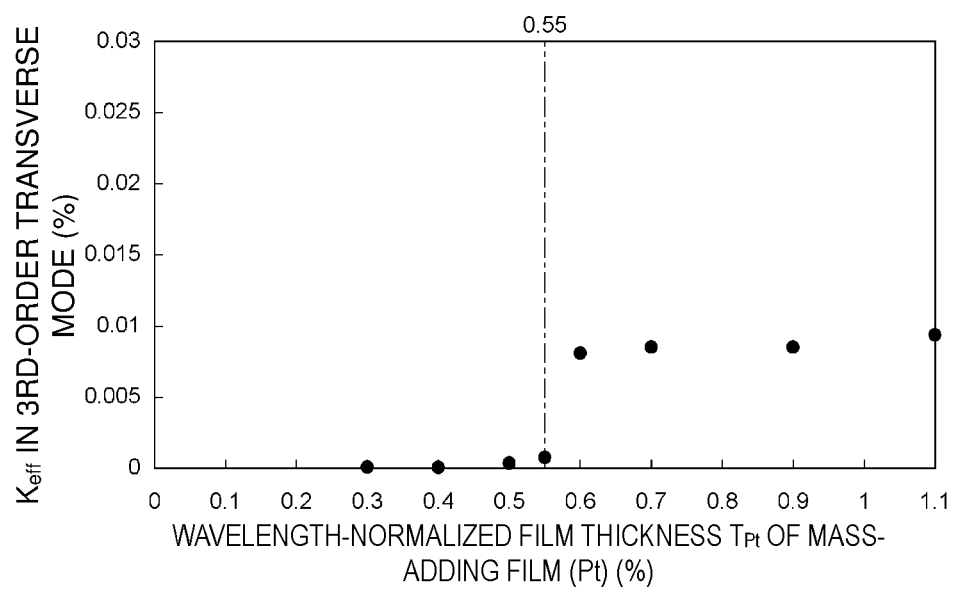
FIG. 15 illustrates the relationship between the wavelength-normalized film thickness of the mass-adding films composed of Pt and the effective coupling coefficient $K_{eff}$ in the third-order transverse mode.

FIG. 15 illustrates the relationship between the wavelength-normalized film thickness of the mass-adding films made of Pt and the minimum value of the effective coupling coefficient $K_{eff}$ in the third-order transverse mode. The minimum value of the effective coupling coefficient $K_{eff}$ in the third-order transverse mode in FIG. 15 refers to a value of the effective coupling coefficient $K_{eff}$ in the transverse mode at the width of the low-acoustic-velocity region when the effective coupling coefficient $K_{eff}$ in the third-order transverse mode is reduced or minimized in the thickness of the mass-adding films.

As described above, because the low-order transverse-mode spurious responses tend to occur near the fundamental-mode resonant frequency, it is particularly preferable to reduce or prevent low-order transverse-mode spurious responses. Here, when the mass-adding film is made of Pt, the wavelength-normalized film thickness $T_{Pt}$ is preferably about 0.55% or less, for example. FIG. 15 indicates that the effective coupling coefficients $K_{eff}$ in the third-order transverse mode at a wavelength-normalized film thickness $T_{Pt}$ of about 0.55% or less are significantly lower than those at a wavelength-normalized film thickness $T_{Pt}$ of more than about 0.55%. Accordingly, the third-order transverse-mode spurious responses are able to be further reduced or prevented.

Figure 16:
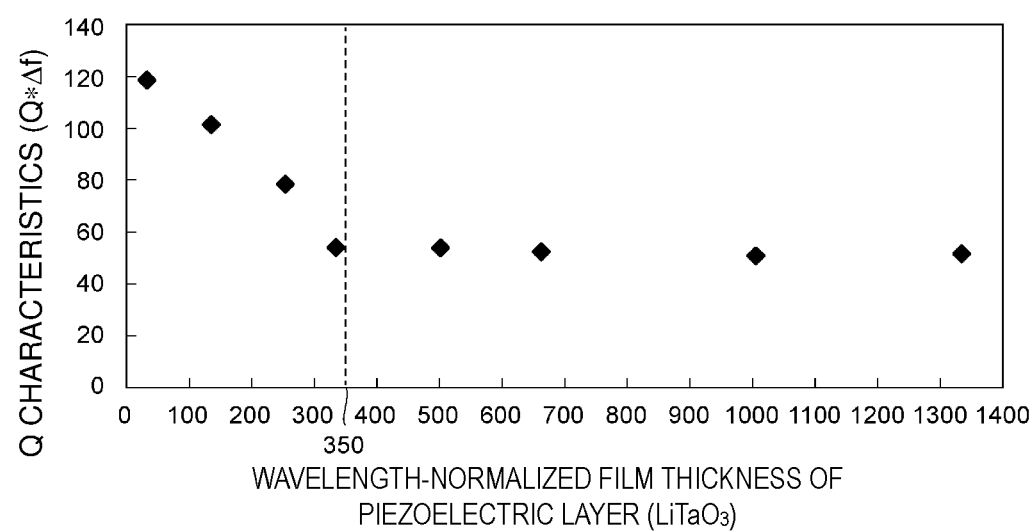
FIG. 16 illustrates the relationship between the wavelength-normalized film thickness of a piezoelectric layer and the Q characteristics.

In the case of the multilayer structure according to the first preferred embodiment as illustrated in FIG. 1, the piezoelectric layer 5 is a piezoelectric thin film and thinner than piezoelectric substrates typically used for elastic wave devices. As illustrated in FIG. 16, when the piezoelectric layer 5 has a wavelength-normalized film thickness of more than about 350%, the Q characteristics are degraded. Thus, the wavelength-normalized film thickness of the piezoelectric layer 5 is preferably about 350% or less, for example. In this case, the Q characteristics are able to be effectively improved.

In the case of the multilayer structure, the low-acoustic-velocity film 4 preferably has a wavelength-normalized film thickness of about 200% or less, for example. A wavelength-normalized film thickness of the low-acoustic-velocity film 4 of about 200% or less results in a reduction in film stress to reduce the warpage of a wafer, thus increasing the percentage of non-defective products and stabilizing the characteristics. Furthermore, when the film thickness of the low-acoustic-velocity film 4 is in the range of about 10% to about 50%, the electromechanical coupling coefficient remains almost unchanged, regardless of the material of a high-acoustic-velocity film according to a first modification described below.

The first modification and a second modification of the first preferred embodiment will be described below. Similar to the first preferred embodiment, the transverse-mode spurious responses are able to be effectively reduced or prevented in the first and second modifications.

Figure 17:
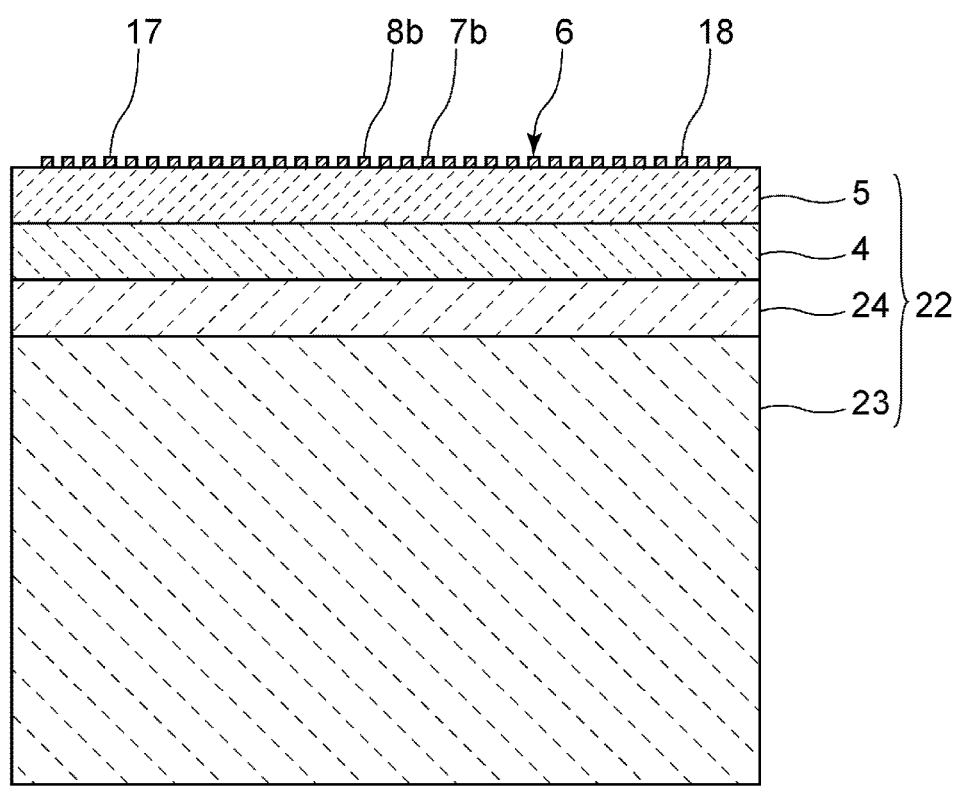
FIG. 17 is a schematic elevational cross-sectional view of an elastic wave device according to a first modification of the first preferred embodiment of the present invention.

FIG. 17 is a schematic elevational cross-sectional view of an elastic wave device according to a first modification of the first preferred embodiment.

The present modification differs from the first preferred embodiment in that a high-acoustic-velocity member layer in a piezoelectric substrate 22 is a high-acoustic-velocity film 24 disposed between a supporting substrate 23 and the low-acoustic-velocity film 4. The elastic wave device according to the present modification has the same or substantially the same structure as the elastic wave device 1 according to the first preferred embodiment, except for the point described above. The material of the supporting substrate 23 according to the present modification is not limited to a material of the high-acoustic-velocity member layer.

The high-acoustic-velocity film 24 is preferably made of, for example, aluminum nitride, aluminum oxide, silicon carbide, silicon nitride, silicon oxynitride, diamond-like carbon (DLC), silicon, sapphire, a piezoelectric material such as lithium tantalate, lithium niobate, or quartz crystal, a ceramic material such as alumina, zirconia, cordierite, mullite, steatite, or forsterite, diamond, magnesia, a material mainly including any of the foregoing materials, or a material mainly including any of mixtures of the foregoing materials. Any material in which an acoustic velocity is relatively high may be used for the high-acoustic-velocity film 24.

Also in the present modification, because the elastic wave device includes the piezoelectric substrate 22 having a multilayer structure in which the high-acoustic-velocity film 24, the low-acoustic-velocity film 4, and the piezoelectric layer 5 are stacked in this order, the elastic wave energy is effectively confined to the piezoelectric layer 5 side.

Figure 18:
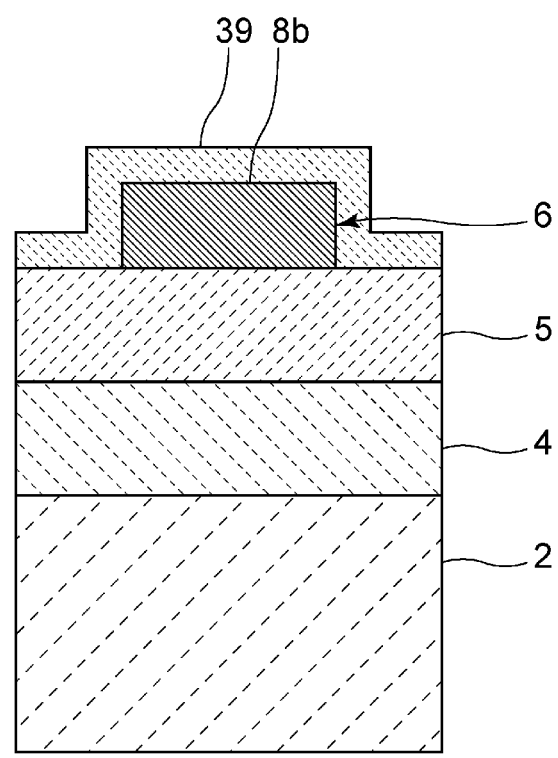
FIG. 18 is an enlarged, schematic elevational cross-sectional view of a portion near a second electrode finger of an interdigital transducer electrode according to a second modification of the first preferred embodiment of the present invention.

FIG. 18 is an enlarged, schematic elevational cross-sectional view of a portion near a second electrode finger of an interdigital transducer electrode according to the second modification of the first preferred embodiment.

The present modification differs from the first preferred embodiment in that mass-adding films 39 are preferably made of an insulating material, such as, for example, an oxide and each of the mass-adding films 39 extends to the piezoelectric layer 5. Specifically, the mass-adding films 39 have a substantially strip shape and extend to the first and second electrode fingers 7b and 8b in the first and second low-acoustic-velocity regions. The elastic wave device according to the present modification has the same structure as the elastic wave device according to the first preferred embodiment, except for the point described above.

Because the mass-adding films 39 are made of the insulating material, interdiffusion between the mass-adding films 39 and the interdigital transducer electrode 6 is less likely to occur. Thus, the interdigital transducer electrode 6 is not easily degraded.

In the present modification, the at least one substantially strip shaped mass-adding film 39 may be disposed in each of the first and second edge regions C1 and C2. Thus, the first and second edge regions C1 and C2 are easily provided. Similarly to the first preferred embodiment, the mass-adding films 39 may be disposed on the respective first and second electrode fingers 7b and 8b and may not extend to the piezoelectric layer 5.

The elastic wave devices according to the foregoing preferred embodiments may be used for, for example, duplexers in high-frequency front-end circuits. A preferred embodiment of a high-frequency front-end circuit according to the present invention will be described below.

Figure 19:
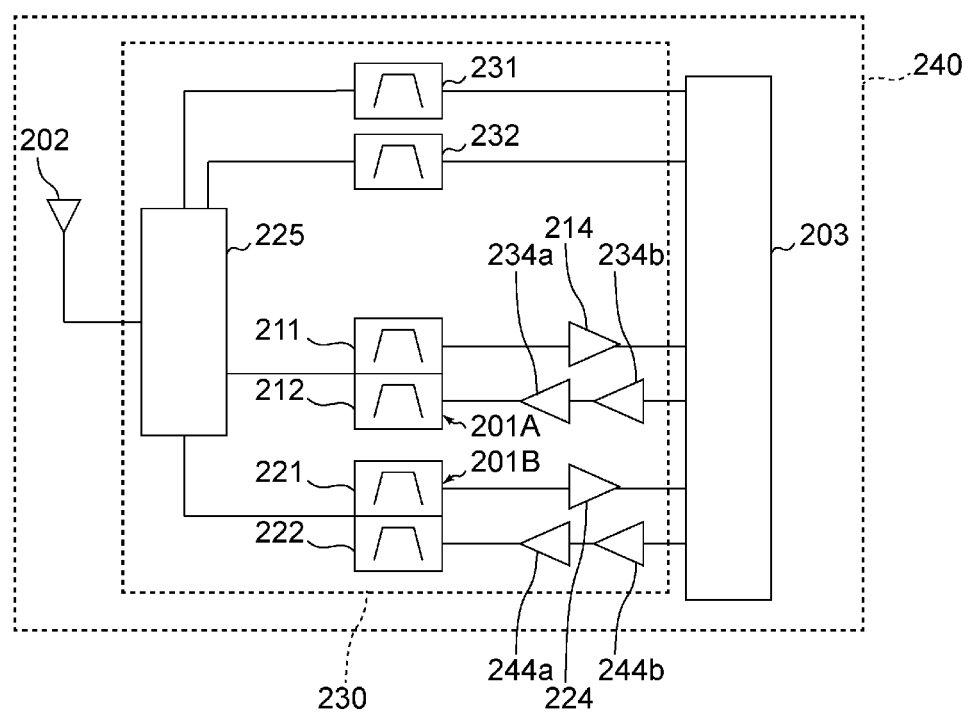
FIG. 19 is a schematic diagram of a communication apparatus including a high-frequency front-end circuit according to a preferred embodiment of the present invention.

FIG. 19 is a schematic diagram of a communication apparatus and a high-frequency front-end circuit. FIG. 19 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 19 are examples of the high-frequency front-end circuit and the communication apparatus according to preferred embodiments of the present invention. The high-frequency front-end circuit and the communication apparatus are not limited to the configuration.

The duplexer 201A includes filters 211 and 212. The duplexer 201B includes filters 221 and 222. The duplexers 201A and 201B are connected to the antenna element 202 via the switch 225. The elastic wave devices according to preferred embodiments of the present invention and modifications thereof may be used for the duplexers 201A and 201B or may be used for the filters 211, 212, 221, and 222.

The elastic wave devices according to preferred embodiments of the present invention and modifications thereof may be used for multiplexers each including three or more filters, for example, triplexers each including three filters that share a common antenna terminal and hexaplexers including six filters that share a common antenna terminal.

Examples of the elastic wave devices according to preferred embodiments of the present invention and modifications thereof include elastic wave resonators, filters, duplexers, and multiplexers each including three or more filters. The configuration of each of the multiplexers is not limited to a configuration including both of a transmitting filter and a receiving filter. Each multiplexer may have a configuration to include only a transmitting filter or only a receiving filter.

The switch 225 connects the antenna element 202 to at least one signal path corresponding to a predetermined band in response to a control signal from a controller (not illustrated), and may include, for example, a single-pole double-throw (SPDT) switch. The at least one signal path connected to the antenna element 202 may be a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing such as down-conversion and feeds a reception signal generated by the signal processing. The RF signal integrated circuit 203 allows a transmission signal fed thereto to be subjected to signal processing such as up-conversion and feeds a high-frequency transmission signal generated by the signal processing to the power amplifier circuits 234a, 234b, 244a, and 244b. The RF signal integrated circuit 203 is preferably, for example, an RFIC. The communication apparatus may preferably include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are, for example, an image signal and an audio signal.

The high-frequency front-end circuit 230 may include duplexers according to a modification of the duplexers 201A and 201B, in place of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

In the high-frequency front-end circuit 230 and the communication apparatus 240 having the configuration described above, the use of an elastic wave devices according to preferred embodiments of the present invention as an elastic wave resonator, a filter, a duplexer, a multiplexer including three or more filters, or other components thereof reduce or prevent the transverse-mode spurious responses.

The elastic wave devices, the high-frequency front-end circuits, and the communication apparatuses according to preferred embodiments of the present invention and modifications have been described. The present invention include other preferred embodiments provided by combinations of the elements in the preferred embodiments and modifications described above, modifications obtained by various modifications of the foregoing preferred embodiments conceived by those skilled in the art without departing from the gist of the present invention, and various devices including the high-frequency front-end circuit and the communication apparatus according to preferred embodiments of the present invention.

Preferred embodiments of the present invention may be widely used in, for example communication devices, such as cellular phones, as elastic wave resonators, filters, duplexers, multiplexers that can be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate; and
an interdigital transducer electrode on the piezoelectric substrate; wherein
the piezoelectric substrate includes:
a piezoelectric layer; and a high-acoustic-velocity member layer in which an acoustic velocity of a bulk wave that propagates through the high-acoustic-velocity member layer is higher than an acoustic velocity of an elastic wave that propagates through the piezoelectric layer, the piezoelectric layer being stacked directly or indirectly on the high-acoustic-velocity member layer;

the piezoelectric layer includes lithium tantalate;

the interdigital transducer electrode includes:
  a first busbar;
  a second busbar facing the first busbar;
  first electrode fingers each including an end portion connected to the first busbar; and
  second electrode fingers each including an end portion connected to the second busbar, the first electrode fingers being interdigitated with the second electrode fingers; wherein denoting an elastic wave propagation direction as a first direction, and denoting a direction perpendicular or substantially perpendicular to the first direction as a second direction, a portion in which the first electrode fingers overlap the second electrode fingers in the first direction is defined as an intersecting region;

the intersecting region includes:
  a central region located in a middle of the intersecting region in the second direction;
  a first low-acoustic-velocity region located on a side of the central region adjacent to the first busbar, an acoustic velocity in the first low-acoustic-velocity region being lower than an acoustic velocity in the central region; and
  a second low-acoustic-velocity region located on a side of the central region adjacent to the second busbar, an acoustic velocity in the second low-acoustic-velocity region being lower than an acoustic velocity in the central region;

the first low-acoustic-velocity region and the second low-acoustic-velocity region include mass-adding films disposed on the first electrode fingers and the second electrode fingers;

the interdigital transducer electrode includes:
  a first high-acoustic-velocity region; and
  a second high-acoustic-velocity region, an acoustic velocity in the first high-acoustic-velocity region and the second high-acoustic-velocity region being higher than an acoustic velocity in the central region;

the first low-acoustic-velocity region is located between the central region and the first high-acoustic-velocity region;

the second low-acoustic-velocity region is located between the central region and the second high-acoustic-velocity region; and denoting a film thickness normalized to a wavelength determined by an electrode finger pitch of the interdigital transducer electrode as a wavelength-normalized film thickness (%), a product of the wavelength-normalized film thickness of the mass-adding films and a density (g/cm$^3$) of the mass-adding films is about 13.4631 (% ·g/cm$^3$) or less.

2. The elastic wave device according to claim 1, wherein a combination of a material of the mass-adding films and an upper limit of the wavelength-normalized film thickness of the mass-adding films is selected from combinations in Table 1:

TABLE 1

|  | Density (g/cm$^3$) | Upper limit of wavelength-normalized film thickness (%) |
| --- | --- | --- |
| Al | about 2.69 | about 5 |
| Ti | about 4.54 | about 2.97 |
| Cu | about 8.93 | about 1.51 |
| Ta | about 16.67 | about 0.81 |
| Au | about 19.3 | about 0.7 |
| Pt | about 21.37 | about 0.63 |
| Aluminum oxide | about 3.98 | about 3.38 |
| Silicon oxide | about 2.21 | about 6.09 |
| Germanium oxide | about 6.2 | about 2.17 |
| Tantalum oxide | about 8.47 | about 1.59. |

3. The elastic wave device according to claim 1, wherein the mass-adding films are made of a metal.

4. The elastic wave device according to claim 3, wherein the mass-adding films are made of Pt and have a wavelength-normalized film thickness of about 0.55% or less.

5. The elastic wave device according to claim 1, wherein the mass-adding films are made of an oxide.

6. The elastic wave device according to claim 1, wherein a low-acoustic-velocity film in which an acoustic velocity of an elastic wave that propagates through the low-acoustic-velocity film is lower than an acoustic velocity of an elastic wave that propagates through the piezoelectric layer is disposed between the high-acoustic-velocity member layer and the piezoelectric layer.

7. The elastic wave device according to claim 6, further comprising:
  a supporting substrate; wherein
  the high-acoustic-velocity member layer is a high-acoustic-velocity film disposed between the supporting substrate and the low-acoustic-velocity film.

8. The elastic wave device according to claim 1, wherein the high-acoustic-velocity member layer is a supporting substrate.

9. The elastic wave device according to claim 1, wherein the piezoelectric layer has a wavelength-normalized film thickness of about 350% or less.

10. A high-frequency front-end circuit comprising:
  the elastic wave device according to claim 1; and
  a power amplifier.

11. The high-frequency front-end circuit according to claim 10, wherein a combination of a material of the mass-adding films and an upper limit of the wavelength-normalized film thickness of the mass-adding films is selected from combinations in Table 1:

TABLE 1

|  | Density (g/cm$^3$) | Upper limit of wavelength-normalized film thickness (%) |
| --- | --- | --- |
| Al | about 2.69 | about 5 |
| Ti | about 4.54 | about 2.97 |
| Cu | about 8.93 | about 1.51 |
| Ta | about 16.67 | about 0.81 |
| Au | about 19.3 | about 0.7 |
| Pt | about 21.37 | about 0.63 |
| Aluminum oxide | about 3.98 | about 3.38 |
| Silicon oxide | about 2.21 | about 6.09 |
| Germanium oxide | about 6.2 | about 2.17 |
| Tantalum oxide | about 8.47 | about 1.59. |

12. The high-frequency front-end circuit according to claim 10, wherein the mass-adding films are made of a metal.

13. The high-frequency front-end circuit according to claim 12, wherein the mass-adding films are made of Pt and have a wavelength-normalized film thickness of about 0.55% or less.

14. The high-frequency front-end circuit according to claim 10, wherein the mass-adding films are made of an oxide.

15. The high-frequency front-end circuit according to claim 10, wherein a low-acoustic-velocity film in which an acoustic velocity of an elastic wave that propagates through the low-acoustic-velocity film is lower than an acoustic velocity of an elastic wave that propagates through the piezoelectric layer is disposed between the high-acoustic-velocity member layer and the piezoelectric layer.

16. The high-frequency front-end circuit according to claim 15, further comprising:
a supporting substrate; wherein
the high-acoustic-velocity member layer is a high-acoustic-velocity film disposed between the supporting substrate and the low-acoustic-velocity film.

17. The high-frequency front-end circuit according to claim 10, wherein the high-acoustic-velocity member layer is a supporting substrate.

18. The high-frequency front-end circuit according to claim 10, wherein the piezoelectric layer has a wavelength-normalized film thickness of about 350% or less.

19. A communication apparatus comprising:
the high-frequency front-end circuit according to claim 10; and
an RF signal processing circuit.

20. The communication apparatus according to claim 19, wherein a combination of a material of the mass-adding films and an upper limit of the wavelength-normalized film thickness of the mass-adding films is selected from combinations in Table 1:

TABLE 1

| | Density (g/cm$^3$) | Upper limit of wavelength-normalized film thickness (%) |
|---|---|---|
| Al | about 2.69 | about 5 |
| Ti | about 4.54 | about 2.97 |
| Cu | about 8.93 | about 1.51 |
| Ta | about 16.67 | about 0.81 |
| Au | about 19.3 | about 0.7 |
| Pt | about 21.37 | about 0.63 |
| Aluminum oxide | about 3.98 | about 3.38 |
| Silicon oxide | about 2.21 | about 6.09 |
| Germanium oxide | about 6.2 | about 2.17 |
| Tantalum oxide | about 8.47 | about 1.59. |

* * * * *